United States Patent
Ristic-Lehmann et al.

(10) Patent No.: US 7,118,801 B2
(45) Date of Patent: Oct. 10, 2006

(54) AEROGEL/PTFE COMPOSITE INSULATING MATERIAL

(75) Inventors: Cedomila Ristic-Lehmann, Elkton, MD (US); Brian Farnworth, Elkton, MD (US); Anit Dutta, Wilmington, DE (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 10/706,777

(22) Filed: Nov. 10, 2003

(65) Prior Publication Data

US 2005/0100728 A1    May 12, 2005

(51) Int. Cl.
*D04H 1/00*    (2006.01)

(52) U.S. Cl. ............ 428/292.1; 524/545; 264/120; 174/255; 428/220

(58) Field of Classification Search ............ 428/292.1, 428/220; 524/545; 264/120; 174/255
See application file for complete search history.

(56) References Cited

U.S. PATENT DOCUMENTS

| | | | | |
|---|---|---|---|---|
| 2,400,099 | A | | 5/1946 | Brubaker et al. ............... 18/55 |
| 2,593,583 | A | | 4/1952 | Lontz ........................ 260/92.1 |
| 4,153,661 | A | | 5/1979 | Ree et al. ................... 264/120 |
| 4,460,642 | A | | 7/1984 | Errede et al. ................ 428/283 |
| 4,985,296 | A | | 1/1991 | Mortimer, Jr. ............... 428/220 |
| 5,294,480 | A | * | 3/1994 | Mielke et al. ................. 442/38 |
| 5,786,059 | A | * | 7/1998 | Frank et al. .................. 428/68 |
| 6,068,882 | A | * | 5/2000 | Ryu ........................... 427/246 |
| 6,172,120 | B1 | | 1/2001 | Smith et al. ................. 516/100 |
| 6,218,000 | B1 | | 4/2001 | Rudolf et al. ............. 428/317.9 |
| 2002/0094426 | A1 | * | 7/2002 | Stepanian et al. ....... 428/292.1 |
| 2004/0029982 | A1 | * | 2/2004 | Erkey et al. .................. 516/98 |

FOREIGN PATENT DOCUMENTS

| | | | |
|---|---|---|---|
| DE | 42-01-306 A1 | * | 7/1993 |
| EP | 552484 A | * | 7/1993 |
| EP | 672635 A | * | 3/1995 |
| WO | WO-9832709 A | * | 7/1998 |
| WO | WO-2005/047381 A1 | * | 5/2005 |

OTHER PUBLICATIONS

S. V. Gangal, "Tetrafluoroethylene Polymer," Mark's Enclyclopedia of Polymer Science & Engineering, vol. 16, p. 577, John Wiley & Sons, 1989.
S. Mazur, "Paste Extrusion of Poly(tetrafluoroethylene) Fine Powders," Polymer Powder Technology, p. 441, John Wiley & Sons, 1995.
"Fine Powder Processing Guide" 202809A (Feb. 1991) from DuPont Polymers, Wilmington, DE.

* cited by examiner

*Primary Examiner*—David W. Wu
*Assistant Examiner*—Henry S. Hu
(74) *Attorney, Agent, or Firm*—Dianne Burkhard

(57) ABSTRACT

A material comprising aerogel particles and a polytetrafluoroethylene (PTFE) binder is formed having a thermal conductivity of less than or equal to 25 mW/m K at atmospheric conditions. The material is moldable or formable, having little or no shedding of filler particles, and may be formed into structures such as tapes or composites, for example, by bonding the material between two outer layers. Advantageously, composites may be flexed, stretched, or bent without significant dusting or loss of insulating properties.

13 Claims, 11 Drawing Sheets

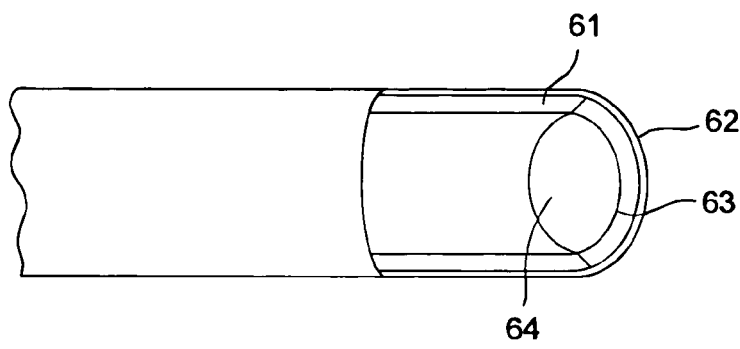 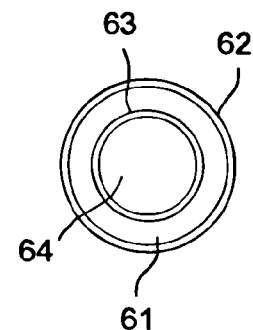
FIG. 6a  FIG. 6b

AEROGEL/PTFE COMPOSITE INSULATING MATERIAL

BACKGROUND OF THE INVENTION

The present invention relates to a material that is useful in multiple applications including insulation applications for garments, containers, pipes, electronic devices and the like. Among other things, the material of the present invention comprising aerogel particles and polytetrafluoroethylene (PTFE), is formable, having low particle shedding and low thermal conductivity. Composites made from the material may be flexed, stretched, and twisted, with little or no shedding of aerogel particles or loss of conductive properties.

Use of aerogels for thermal insulation and the low thermal conductivity of aerogels is well known. Favorable thermally conductive properties result from the very high porosity of aerogel which is greater than about 95%, and the small pore size of aerogel material which is less than the size of the mean free path of air molecules at atmospheric pressure, or less than about 100 nm. Because of the small pore size, the mobility of air molecules within the material is restricted, and the effectiveness of air in conducting heat is reduced, resulting in low thermal conductivity. Under atmospheric conditions air has a thermal conductivity of about 25 mW/m K (milliwatt per meter Kelvin). Insulation having larger pore sizes, such as foam, batting, wool, and other common thermally insulating materials, has a thermal conductivity of about 40 mW/m K, which is higher than that of air due to the contribution of radiation and solid conduction. Aerogel powders and beads are known to have a thermal conductivity of about 9 to 20 mW/m K. However, such highly porous and low density material is not useful for many applications in the form of a powder due to the extensive dusting which makes installation, handling, forming and shaping particularly difficult, and further raises safety issues.

Traditional methods of making aerogels usually include extraction with supercritical fluids. The methods often include the steps of pouring an aerogel precursor liquid into a mold, drying the aerogel liquid to form a highly porous gel structure with a variety of liquid exchanges, and using supercritical fluid extraction to form an aerogel monolith. Processes, such as those using supercritical fluid extraction, are very time consuming and expensive. Further, the structures produced are rigid and have low mechanical strength and have limited ability to be further molded or formed into desired shapes after the aerogel material is formed. These materials often crack or shatter upon flexing and are known for shedding or "dusting" of fine aerogel particles.

In an attempt to increase the flexibility and strength of aerogel material, Stepanian et al. U.S. Patent Publication 2002/0094426 teach aerogel materials combined with a reinforcing structure, specifically a lofty fibrous batting. Preferably, the aerogel is reinforced by a fibrous batting structure in combination with randomly oriented microfibers and/or conductive layers. To form the aerogel sheet, an aerogel-forming precursor liquid is poured into the batting and supercritically dried to form an aerogel. It is taught that the resulting reinforced aerogel structure is drapable, less prone to shattering upon flexing and less prone to shedding of fine aerogel particles. However, applications for such materials are limited due to a lack of moldability and formability of these structures, as well as the costs associated with supercritical extraction steps.

To overcome the brittleness often associated with reinforced aerogels, U.S. Pat. No. 5,786,059, to Frank et al. teaches gluing aerogel powders together to form a continuous product. Specifically, an aerogel composite material having a layer of fiber web and aerogel particles is preferably formed as a mat or panel. The fiber web comprises a bicomponent fiber material of two firmly interconnected polymers having lower and higher temperature melting regions into which aerogel particles are sprinkled. Upon heating to the lower melt temperature, the fibers of the web are bonded to each other as well as to the aerogel particles. The resulting composites are relatively stiff structures, and upon the application of mechanical stress, granules break or become detached from the fiber so that aerogel fragments may fall out from the web.

Smith et al., in U.S. Pat. No. 6,172,120, disclose a process for the manufacture of aerogels wherein aerogels are formed as powders instead of monolithic blocks or sheets. The manufacturing process has the advantage of aerogel formation without the step of supercritical fluid extraction. However, in the form of a powder, aerogel is not useful for many applications due to high dusting and lack of formability.

There is a need for an insulating material that overcomes problems inherent in aerogel powders and composites, such as the lack of formability of aerogel powder and the lack of flexibility of composites, as well as the shedding or dusting of aerogel particles upon application of mechanical stress. There is a need for low conductivity, low shedding insulating materials that can be molded or formed into any desired shape subsequent to the formation of the insulating material composition, and which, therefore, can be easily suited to a wide variety of applications. Further, insulating materials which may be prepared without the high processing cost often associated with aerogel insulation would be greatly desired.

SUMMARY OF THE INVENTION

Formable, moldable, low dusting materials with low thermal conductivity have been invented and are disclosed herein. These materials are sufficiently moldable to be formed into flexible three-dimensional structures or shapes having curves in one or more directions. Further, the materials optionally form stretchable structures with minimal dusting upon stretching.

Materials of the present invention comprise aerogel particles and polytetrafluoroethylene (PTFE) as a binder. Preferred materials may be formed having a consistency or texture of powder or putty, and also may be formed into shaped structures having good mechanical strength and flexibility. Properties of the shaped structures, such as mechanical strength and thermal conductivity may be affected partly by the relative proportions of the aerogel and PTFE. For example, higher proportions of aerogel particles typically result in lower thermal conductivity and higher proportions of PTFE typically result in a structure with greater mechanical strength.

In use, the material may be contained between multiple surfaces of an article, such as the rigid surfaces of a double walled pipe, duct or container to form, for example, an insulated article. Alternately, a composite structure may be formed by containing the material of the present invention between other materials, such as outer layers of flexible membranes, films or foils of polymer, paper or metal. Optionally, elastic membranes are used, making the composite structure stretchable and highly drapable. Likewise, outer layers may be gas permeable or impermeable to liquids and gases, forming either permeable or impermeable composite structures. Where the composite structure is impermeable, the thermal conductivity may be further lowered by applying a vacuum to form a composite structure having reduced pressure.

In addition to use as thermal insulation, it has been found that composites made from the materials of the present invention may also be useful dielectric materials when constructed with components having exceptionally low dielectric constants. For example, in one embodiment where the dielectric constant of an aerogel is about 1.1 and that of PTFE is about 2.1, a preferred composite of these materials has a dielectric constant of less than about 1.18. Composites made from materials of the present invention may also be used as acoustic barriers. Composite material having good sound absorption at specific frequencies, may be formed by using materials of the present invention between particular outer layers that act as reflective sound barriers. Preferred composites for this application have a relatively high sound transmission loss of up to about 20 to 30 dB over a range of frequencies (about 400–6300 Hz), and a high sound absorption coefficient of up to about 0.5–0.6 at a frequency of about 3500 Hz.

Preferred applications for materials of the present invention include the formation of insulating materials and composites made therefrom for use in apparel, such as glove and footwear insulation inserts, garments, and inserts for garments, pipe insulation, cryogenic insulation, electronic devices, cookware, home appliances, storage containers and packaging of food and pharmaceuticals, immersion suits, as well as dual function insulation, such as acoustic and thermal insulation, electric and thermal insulation, and the like.

DESCRIPTION OF THE DRAWINGS

FIG. 6a is a diagrammatic half-sectional representation of a double-walled pipe with insulating material between pipe walls.

FIG. 6b is a diagrammatic representation of a cross-sectional view of a double-walled pipe with insulating material between pipe walls.

DETAILED DESCRIPTION OF THE INVENTION

Figure 1:
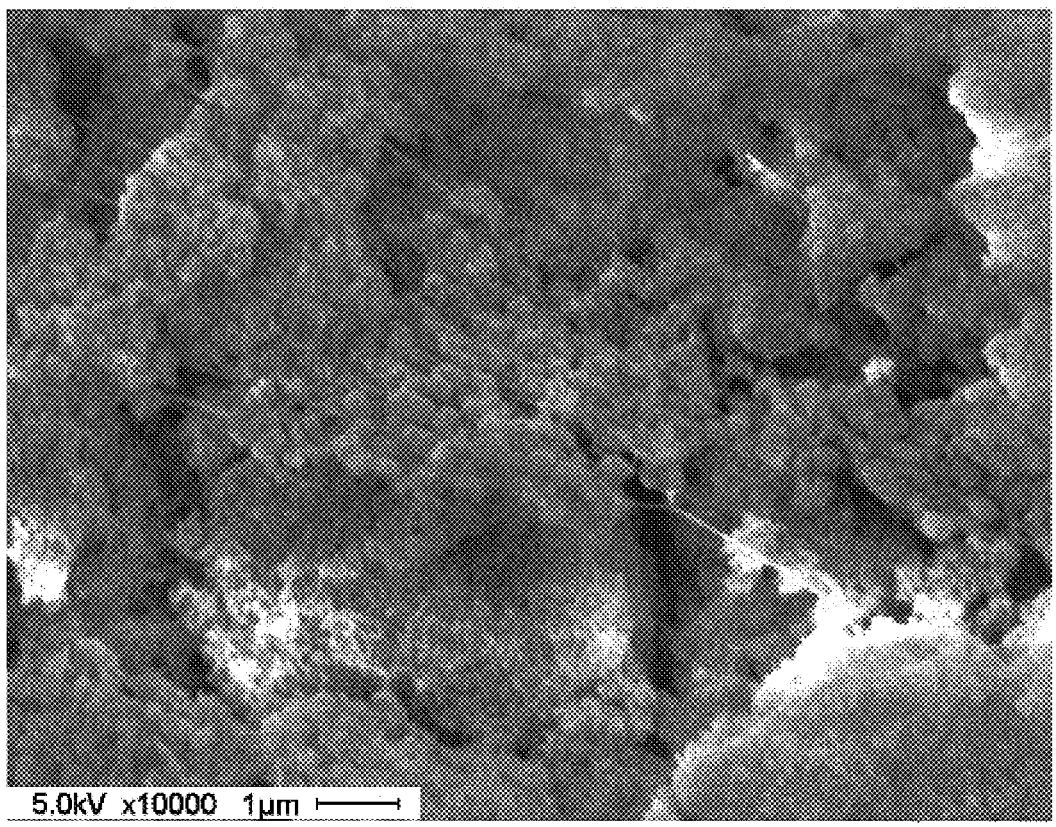
FIG. 1 is an SEM of an insulating tape material containing 60% wt aerogel and 40% wt PTFE magnified at 10000×.

The low thermally conductive material of the present invention comprises aerogel particles and a polytetrafluoroethylene (PTFE) binder. Advantageously, the material may be formed as a powder or putty. By "putty" it is meant that the material has a dough-like consistency that is formable or moldable, having little or no shedding of filler particles. Thus, the material of the present invention has reduced shedding or dusting of fine particles compared to other aerogel-containing material. The material is useful as a powder or putty, for example, between two surfaces, or as an insulating structure in a molded or shaped form, or as a composite. Preferred composites include insulating structures, such as tape, having the material of the present invention bonded between two outer layers, such as films or membranes. Composites advantageously may be made stretchable, flexible and bendable, without significant dusting or loss of insulating properties.

Aerogel particles are preferred filler materials and are known to have exceptionally low density and low thermal conductivity. Preferred aerogela have a particle density of less than about 100 kg/m$^3$ and a thermal conductivity of less than or equal to about 25 mW/m K at atmospheric conditions (about 298.15 K and 101.3 kPa), and more preferably, less than or equal to about 15 mW/m K. Aerogels suitable for use in the material of the present invention include both inorganic and organic aerogels, and mixtures thereof. Useful inorganic aerogels include those formed from an inorganic oxide of silicon, aluminum, titanium, zirconium, hafnium, yttrium, vanadium, and the like, with silica aerogels being particularly preferred. Organic aerogels are also suitable for use in the present invention and may be prepared from carbon, polyacrylates, polystyrene, polyacrylonitriles, polyurethanes, polyimldes, polyfurfural alcohol, phenol furturyl alcohol, melamine formaldehydes, resorcinal formaldehydes, cresol, formaldehyde, polycyanurates polyacrylamides, epoxides, agar, agarose, and the like.

Aerogels in powdered form are readily available commercially. For example, a silica aerogel formed by a relatively low cost process is described by Smith et al. in U.S. Pat. No. 6,172,120. The size of aerogel particles can be reduced to a desired dimension or grade by jet-milling or other size reduction techniques. For making insulating materials of the present invention, aerogel particles milled to particle sizes ranging from about 5 μm to about 1 mm (aerogel beads) are preferred, with particles milled to less than or equal to about 10 μm being more preferred. It is believed that smaller aerogel particles form a more uniform mix with other components of the insulating material. Aerogels having smaller pore sizes, for example, an average pore size of less than or equal to about 100 nm are therefore preferred over aerogels having larger pore sizes.

Aerogels are available in both hydrophilic and hydrophobic forms. Hydrophilic aerogels typically have a higher thermal conductivity of about 18 mW/m K or more, and may be less useful for certain thermal and/or electrical insulation applications due to water absorption. Hydrophobically treated aerogels typically have thermal conductivity of less than about 15 mW/m K, which is lower than that of hydrophilic aerogels, and have good water repellency, which makes them very suitable for many thermal insulation applications. Hydrophobic aerogels with a thermal conductivity of about 14 mW/m K or lower are preferably used for insulating material described in this invention. Particle size reduction techniques, such as milling, may affect some of the external surface groups of hydrophobic aerogel particles resulting in partial surface hydrophilicity, while hydrophobic properties are retained within the particle. However, aerogel having partial surface hydrophilicity may exhibit enhanced bonding to other compounds and may be preferred for applications where bonding is desirable.

The material of the present invention further comprises PTFE. It is most preferred that PTFE particles are used that are smaller than the aerogel particles, for example ranging from about 50 nm to about 600 µm; however, similarly sized PTFE particles are also useful. PTFE primary particles having a size of about 50 nm or greater, and PTFE aggregates of about 600 µm or less are preferred. To form material in accordance with the present invention, an aerogel/binder mixture is prepared which preferably comprises greater than or equal to about 40% wt of aerogel, greater than or equal to about 60% wt, or greater than or equal to about 80% wt aerogel. Preferred mixtures comprise an aerogel/PTFE mixture comprising between about 40% wt to 95% wt aerogel, and 40% to about 80% wt aerogel. PTFE particles comprise preferably less than or equal to about 60% wt of the aerogel/PTFE binder mixture, less than or equal to about 40% wt of the mixture, or less than or equal to about 20% wt of the aerogel/PTFE binder mixture. Preferred mixtures comprise an aerogel/PTFE mixture comprising between about 5% wt to 60% wt PTFE, and 20% wt to about 60% wt PTFE. Properties such as thermal conductivity, dusting, formability and strength may be tailored in part by varying the ratio of the weight percentage of aerogel to PTFE in the mixture. For example, as the aerogel proportion increases, the strength of structures formed from this material may diminish and the thermal conductivity may become lower. Likewise, material having a higher proportion of PTFE may provide structures having higher mechanical strength, greater formability and minimal dusting.

The material of the present invention may optionally comprise additional components. Optional components may be added to the aerogel/PTFE binder mixture such as finely dispersed opacifiers to reduce radiative heat transfer and improve thermal performance, and include, for example, carbon black, titanium dioxide, iron oxides, silicon carbide, molybdenum silicide, manganese oxide, polydialkylsiloxanes wherein the alkyl groups contain 1 to 4 carbon atoms, and the like. Additionally, polymers, dies, plasticizers, thickeners, various synthetic and natural fibers, are optionally added, for example, to increase mechanical strength and to achieve properties such as color and thermal stability, elasticity and the like. Optional components are preferably added at less than about 10% wt of the mixture used to form the aerogel/PTFE binder material of the present invention.

The material of the present invention may be formed by a number of methods including coagulation and dry blending of the aerogel and PTFE components. Coagulation and dry blending of compositions comprising PTFE are known in the art and are described, for example, in U.S. Pat. Nos. 4,985,296 and 6,218,000, and in the present examples. One method particularly useful in forming the material of the present invention comprises the steps of forming a mixture of an aqueous dispersion of aerogel particles and a PTFE dispersion, and coagulating the mixture by agitation or by the addition of coagulating agents. The resulting co-coagulation of the PTFE in the presence of the aerogel particles creates an intimate blend of the PTFE and the aerogel particles. The coagulum is drained and dried in a convection oven at about 433.15 K. Depending on the type of wetting agent used, the dried coagulum may be in the form of loosely bound powder, or in the form of soft cakes that may then be chilled and ground to obtain the insulating material in the form of a powder. This powder may be further processed to form, for example, a putty, shaped structure, or insulated article.

Preferably, the PTFE dispersion is an aqueous colloidal dispersion of high molecular weight PTFE particles formed by emulsion polymerization. PTFE emulsion polymerization methods are known, and methods useful for producing materials suitable for the present invention are described extensively in the literature (e.g. S. V. Gangal, "Tetrafluoroethylene Polymer", Mark's Encyclopedia of Polymer Science and Engineering, vol. 16, p 577, John Wiley & Sons, 1989.) Suitable aqueous dispersions comprise about 20% to 70% by weight of PTFE having primary particles ranging in size from about 0.05 µm to about 0.5 µm. Examples of aqueous PTFE dispersions presently commercially available include Teflon™ 30, Teflon™ 35 (from E.I. Dupont de Nemours, Wilmington, Del.), and as Fluon™ AD300S, Fluon™ AD704 (from Asahi Fluoropolymer, Chadds Ford, Pa.). Thus, one further embodiment of the present invention is directed to a dispersion comprising an aqueous dispersion of aerogel particles and an aqueous dispersion of high molecular weight PTFE particles.

Also useful, is a PTFE component comprising fine powder PTFE, obtained by coagulating PTFE dispersions formed from emulsion polymerization and drying the flocculated coagulum into a fine powder. Preferred PTFE fine powders typically are of very high molecular weight and are in the form of aggregates of PTFE primary particles, wherein the aggregates range in size from 200 µm to about 600 µm. Preferred PTFE fine powder resins are available as Teflon™ 60, Teflon™ 6C, Teflon™ 610A (E.I. Dupont de Nemours, Wilmington, Del.), and as Fluon™ CD123 (Asahi Fluoropolymer, Chadds Ford, Pa.). The method of dry blending comprises the processing steps of dry blending aerogel and PTFE particles, with or without lubricants. Processing at different shearing rates and temperature regimes may result in varying uniformity of the mixture components in the material of the present invention, as well as differing mechanical strengths of the resulting insulating structures. Preferred methods of dry blending at higher shearing rates and at lower temperature often yield material having higher uniformity of components and produce structures having higher mechanical strength.

The material of the present invention may also be subjected to shear stress or force while being molded, formed or otherwise processed into structures or composites, which may affect the properties of the resulting material. In one embodiment, upon the application of shear stress at about 303.15–453.15 K, the material of the present invention forms a putty. Though not wishing to be bound by theory, it is believed that when PTFE primary particles are subjected to deformation while being in contact to one another, PTFE particles become connected by the formation of fine fibrils (S. Mazur, "Paste Extrusion of Poly(tetrafluoroethylene) Fine Powders" in Polymer Powder Technology, p 441, John Wiley & Sons, 1995). It is believed that the size of these fibrils ranges from about 0.02 µm to about 0.1 µm in diameter, typically about 0.04 µm. It is further believed that shear or extensional deformation-induced fibrillation of the PTFE primary particles leads to creation of a scaffold or cage-like structure. Preferably, the fibrils of the PTFE particles interconnect with other PTFE fibrils or to PTFE particles to form a net within and around which the aerogel particles are situated, and are thus bound together. Therefore, for the material of the present invention comprising aerogel particles and a PTFE binder, it is thought that because of the unique interconnected microstructure of the PTFE phase, the aerogel has improved binding leading to a number of beneficial features such as better handleability, improved moldability, lower dusting/particle shedding, better flexibility and so on.

Where the material of the present invention comprises aerogel particles and a PTFE binder, by "binder," "bind," or "binding" it is meant that particles of aerogel are caused to be held together or cohere with other aerogel particles, or additional optional components by the PTFE component. Preferably, at least a portion of the PTFE component is fibrillated and at least a portion of the fibrils interconnect, attaching to other PTFE fibrils or to PTFE particles, holding the aerogel particles and binding the aerogel/PTFE structure together. Thus, preferred material of the present invention comprises aerogel particles and a fibrillated PTFE component comprising interconnected fibrils.

Figure 2:
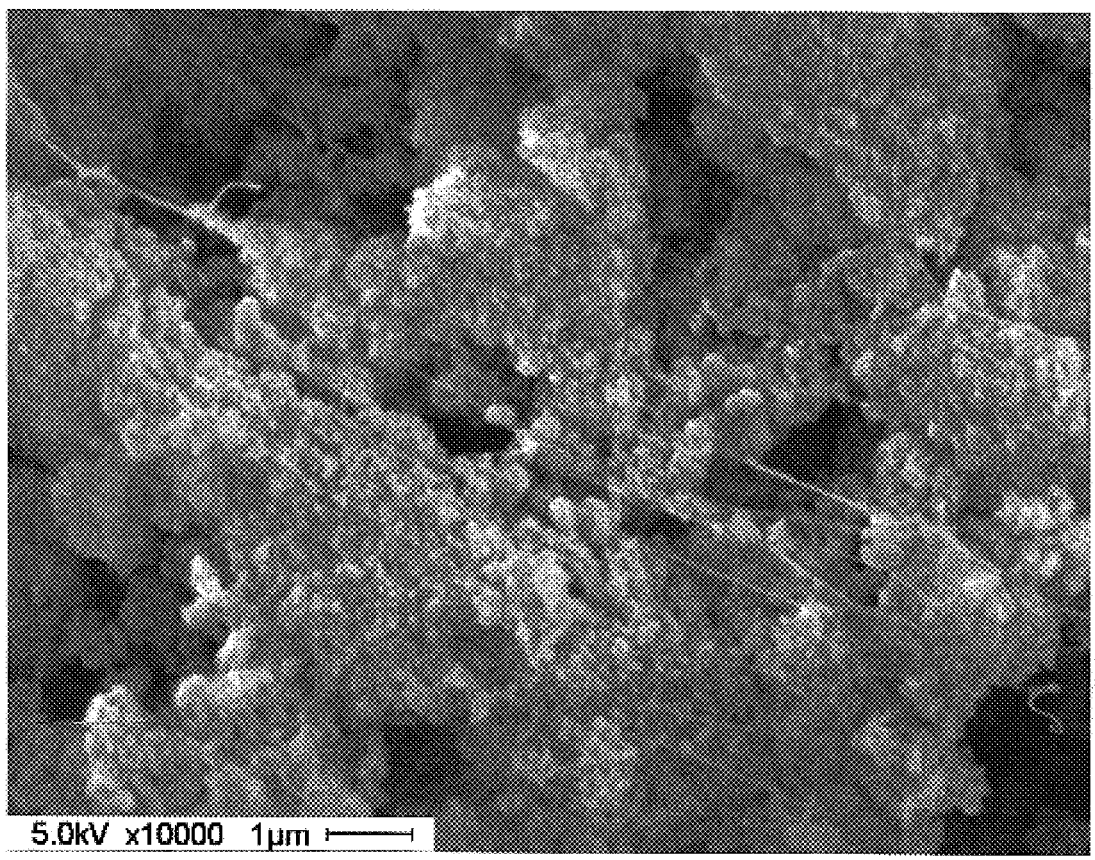
FIG. 2 is an SEM of an insulating tape material containing 80% wt aerogel and 20% wt PTFE magnified at 10000×.
Figure 3:
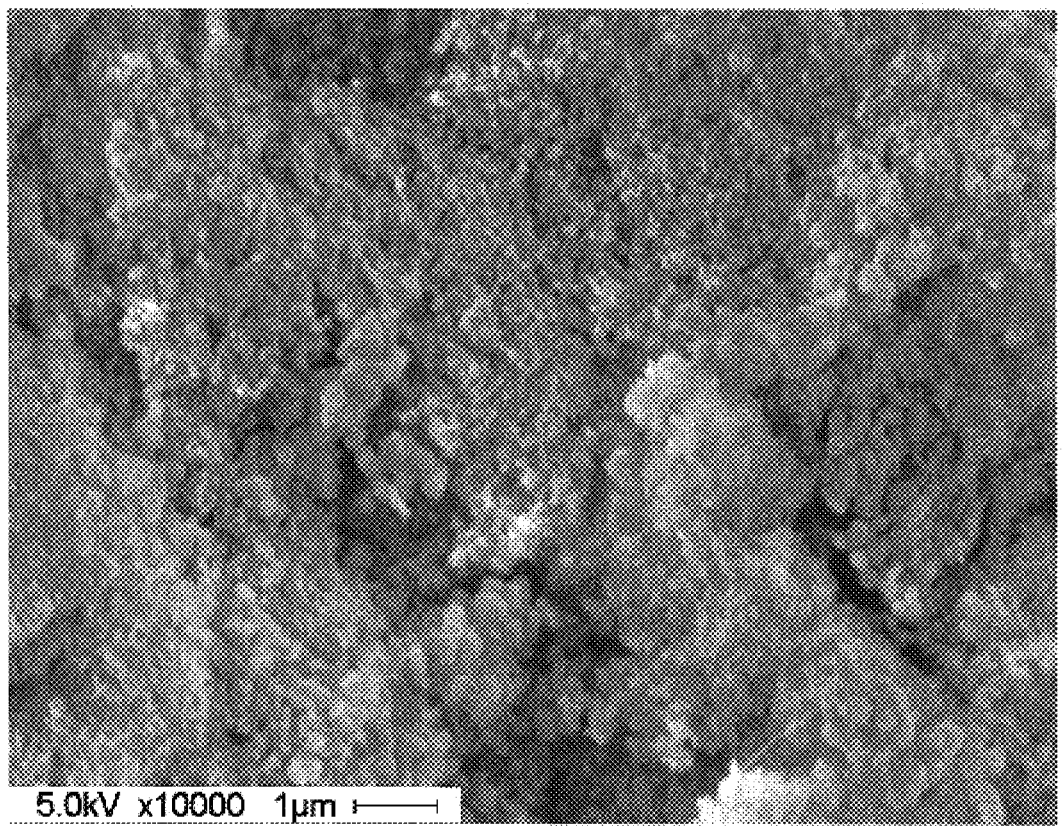
FIG. 3 is an SEM of insulating powder material containing 80% wt aerogel and 20% wt PTFE magnified at 10000×.

The degree of fibrillation of PTFE primary particles may depend on several factors such as the magnitude of shear forces applied, temperature, presence of any lubricating fluid between the primary particles, and the like. A higher degree of fibrillation of PTFE particles is believed to yield material with higher formability, lower particle shedding and higher mechanical strength of the resulting structures or composites. Preferred material of the present invention is non-dusting or low-dusting, and while the degree of aerogel binding or PTFE interconnection may vary depending upon factors such as amounts of PTFE and the magnitude of shear forces applied, it is believed that binding advantageously reduces aerogel dusting when the insulating material is molded, flexed, stretched, twisted, wrapped, or otherwise manipulated. Fibrils extend from the PTFE particles to other PTFE fibrils or particles as depicted in FIGS. 1 and 2. FIG. 1 is an SEM of a preferred insulating tape comprising 60% wt aerogel and 40% wt PTFE magnified at 10000×. FIG. 2 is an SEM of the preferred insulating tape of the present invention containing 80% wt aerogel and 20% wt PTFE magnified at 10000×. FIG. 3 is an SEM of a coagulated aerogel and PTFE powder mixture containing 80% wt aerogel and 20% wt PTFE magnified at 10000×. The tapes of FIGS. 1 and 2, made through the application of shear or extensional forces, may show higher degree of PTFE fibrillation than the co-coagulated powder (FIG. 3).

The thermal conductivity of preferred materials of the present invention having about 40% to greater than about 80% wt aerogel, is less than or equal to about 25 mW/m K at atmospheric conditions. These materials preferably have a density of between about 100–400 kg/m$^3$. Further preferred are materials that have thermal conductivity of less than or equal to about 20 mW/m K, and most preferably, less than or equal to about 17 mW/m K at atmospheric conditions. In one embodiment, an insulating material is formed comprising a mixture of hydrophobic aerogel particles and a binder comprising hydrophobic PTFE particles. Insulating material is formed that is highly hydrophobic and water resistant at atmospheric conditions; such material is therefore suitable for many thermally insulating applications.

The material of the present invention may occupy a cavity or space between at least two surfaces to form an insulated article. The surfaces, independently, may be either flexible or rigid. One embodiment comprises an insulated article having at least two surfaces, and material of the present invention located between at least a first and second surface of the article. Preferably, at least one of the surfaces is a rigid surface, and more preferably, the surfaces are solid and non-porous. For example, an article having at least two surfaces may be a double-walled container, such as double-walled pipes, cryogenic dewars, manifolds, and the like. An insulated article is therefore formed where the material may substantially fill the space between two walls of the double-walled container. FIGS. 6a and 6b are half-sectional and cross-sectional, respectively, diagrammatic representations of one preferred embodiment of an insulated article of the present invention comprising a double-walled pipe having an annular pipe cavity 64, and the material of the present invention 61 within the space between two pipe wall surfaces 62 and 63. Alternatively, the material of the present invention may be contained between flexible surfaces, such as rubber, polymers, thin metallized foils, textiles, and the like, for applications including insulating inserts for use in apparel such as gloves, footwear or for use in garments.

The material of the present invention may be formed as a putty, or molded or shaped into any desired shape, for example, cylindrical, spherical, rectangular, and the like to form an insulating structure. The material may be molded or formed into a structure by any known process such as roll processing, calendering, compression molding, and paste extrusion to form two or three-dimensional shapes. The thermal conductivity of preferred insulating structures at atmospheric pressure is less than or equal to about 25 mW/m K, further preferred of less than or equal to about 20 mW/m K, and most preferably, less than or equal to about 17 mW/m K. Preferred structures have a density of about 100 to 400 kg/m$^3$. A preferred method of forming an insulating structure of the present invention comprises providing a material comprising aerogel particles and a PTFE binder, applying shear force to the material, and forming the material into a shaped, insulating structure, wherein the insulating structure has a thermal conductivity of less than or equal to 25 mW/m K at atmospheric conditions.

One embodiment of the present invention is directed to a shaped insulating structure comprising the material of the present invention that has been formed into a tape. Preferred tapes have a thickness of greater than or equal to about 0.5 mm, and preferably between about 0.5 mm and 10 mm. A preferred tape forming process is paste extrusion, wherein tape having good mechanical strength properties, and which is low to non-dusting is formed. Methods for paste extruding PTFE are well known ("Fine powder processing guide" 202809A (2/91) from Dupont Polymers, Wilmington, Del.), and are suitable for use in the present invention. In this method, the co-coagulated powder comprising aerogel and PTFE is uniformly mixed with a lubricant to create a lubricated powder. Lubricants including hydrocarbon lubricants such as mineral spirits, solvent naptha and the like may be used. Depending upon the aerogel content of the dry powder, the amount of lubricant may range from about 100 to about 400 parts by weight based on 100 parts by weight of the dry powder. The lubricated powder, or lubricated powder in the shape of a preform, can be charged in the barrel of a paste extruder and extruded with a ram, and optionally rolled thereafter along the extrusion direction using pressure rolls to form a shaped article. The lubricant is then removed by drying the article. Another common method of forming insulating tape structures utilizes two-roll processing as taught in earlier patents such as U.S. Pat. Nos. 2,400,099; 2,593,583; 4,153,661 and 4,460,642.

A further embodiment is directed to a composite structure comprising the material of the present invention that has been placed between two layers. The material of the present invention is formed as a core between two layers such as membrane, film or foil, or combinations thereof, and the composition of the two layers may be the same or different, depending upon the application. Individual layers may optionally include multi-layered forms such as laminates, coatings and the like. At least one of the layers may be permeable or impermeable to gases or liquids. Preferably, at least one of the layers is formed from materials selected from polymers, such as expanded polytetrafluoroethylene (ePTFE), polyurethane, silicone, polyethylene, polyester and the like, rubber, metal foil such as aluminum or copper, or metallized polymer foil.

Figure 4:
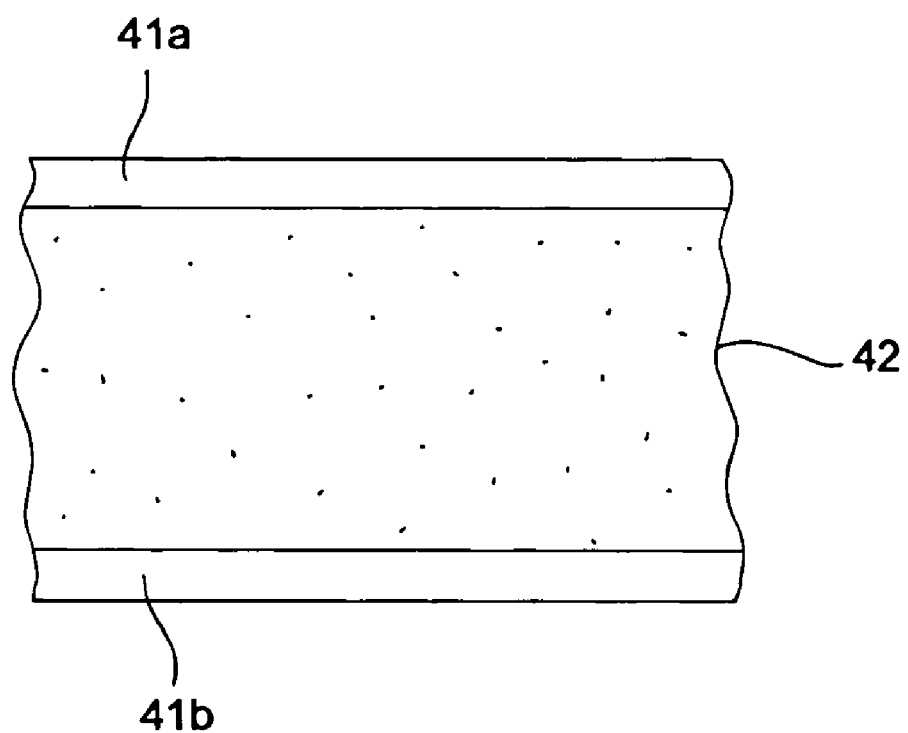
FIG. 4 is a cross-sectional view of a tape having two membrane layers with insulating material between the layers.
Figure 5:
FIG. 5 is an SEM of a tape having two membrane layers with insulating material containing 60% wt aerogel and 40% wt PTFE between the layers magnified at 50×.

Core material can be molded to any desired thickness, and preferably has a density in the range of between 100 to 400 kg/m$^3$. The composite structure is preferably formed as tape or compression molded parts having a thickness of greater than or equal to about 0.5 mm, and preferably from about 0.5 mm to 50 mm or more, depending on the application. Preferably, the aerogel comprises greater than or equal to about 40% wt, greater than or equal to about 60% wt, or greater than or equal to about 80% wt of the core insulating material. In one embodiment, the material of the present invention forms a core that is bonded between the two outer layers. In one embodiment core material bonds to at least one outer layer of a composite, for example by adhering or sticking to surfaces such as films or membranes suitable for use in the present invention. Composite structures may be formed in which the core material is bonded to outer layers without the need for adhesive compounds. However, in addition to non-adhesive bonding, adhesives, such as fluoropolymer, urethane, silicone, epoxy, and other suitable adhesives may also be used. FIG. 4 is a cross-section of a tape of the present invention having two outer layers 41a and 41b and insulating material core 42 between the outer layers, wherein the outer layers may be the same or different. FIG. 5 is an SEM at 50× magnification of a tape having two outer expanded polytetrafluoroethylene (ePTFE) membrane layers between which is an insulating material core comprised of 60% wt aerogel and 40% wt PTFE.

Figure 7:
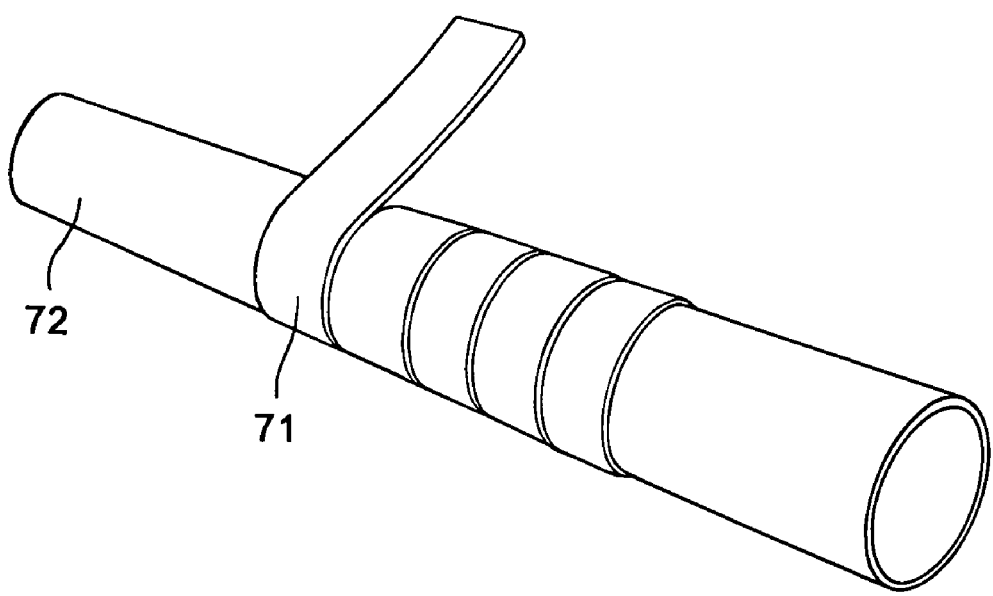
FIG. 7 is a diagrammatic representation of a perspective view of a pipe wrapped with a tape of the present invention.

One embodiment of the present invention is an insulating composite tape structure for use in wrapped applications including pipe and container insulation applications. The preferred structure comprises a core insulating material having an aerogel proportion ranging from about 40 to about 80% wt, and optionally, an opacifier, such as carbon black or TiO$_2$ in an amount of less than about 10% wt, and two layers of expanded polytetrafluoroethylene (ePTFE) membrane. The core may be bonded between the two layers of ePTFE with or without the use of an adhesive. However, adhesives may preferably be used where the application or material selection necessitates a stronger bond. A tape insulating structure may be used to wrap items such as pipes to form insulated pipes for example for use in cryogenic, sub-sea oil and gas transportation pipes, and the like, various containers, long reactors and dewars. Insulating tapes for wrapping applications are highly flexible, and may wrap around an article having a diameter as small as about five (5) mm without dusting or cracking, and without any substantial change or increase in thermal conductivity. By "substantial" it is meant a change in thermal properties of about ±1 to 3 mW/m K. FIG. 7 is a diagrammatic representation of an insulated article of the present invention illustrating a perspective view of a pipe 72 wrapped with a tape of the present invention 71.

A further embodiment is a composite structure in which at least one layer is impermeable to liquids and/or gases. Impermeable layers may be selected from, for example, membranes such as ePTFE which render the structure impermeable to liquid water up to pressures of several hundred kPa. Moreover, metal foils or metallized polymer foils may be used to form composites that are resistant to the diffusion of gases. Metal foils suitable for use in the present invention include aluminum or copper. Metallized polyester films, for example, may be used as gas impermeable layers that maintain vacuum pressures of less than 10 kPa for several years. Impermeable composites are useful in applications requiring materials having resistance to toxic and reactive gases, including military uses, industrial applications and the like.

In one embodiment, material of the present invention is a core between sealed impermeable outer layers, forming a sealed impermeable composite having a thermal conductivity that is further lowered by reducing the pressure within the sealed composite, to below atmospheric pressure by application of a vacuum. Preferred materials of the present invention have about 40 to 95% wt aerogel for use in applications where the composites are under a vacuum of about 10$^{-6}$ kPa to about 100 kPa. Preferred materials may have a thermal conductivity of less than or equal to about 10 mW/m K, and more preferably from about 4 to about 10 mW/m K, under vacuum of approximately 1.5 kPa when measured at ambient temperature. Moreover, materials of the present invention are further suitable for use in cryogenic applications, where under cryogenic conditions of low temperatures and reduced pressure, the thermal conductivity of the material is further reduced. For example at cryogenic temperature of about 77 K, one embodiment of the present invention has thermal conductivity of 13.7 mW/m K at atmospheric pressure, and thermal conductivity of about 1 mW/m K at vacuum of 1.33×10$^{-4}$ kPa. In another embodiment, under small pressure loads of up to about 10 kPa, which is often a pressure level achieved in glove applications, the thermal conductivity of a preferred composite may drop by about 1 to 3 mW/m K due to reduction of the size of the larger pores between the aerogel and the PTFE particles. Most preferred tape structures have low compressibility when subjected to a uniaxial pressure of about 10 kPa, exhibiting compressibility of only up to about 25%.

In another embodiment a composite is formed wherein at least one of the outer layers is permeable to gases and vapors. Permeable layers may include layers comprising ePTFE or other microporous membranes, woven or nonwoven fabrics, paper, and the like. Vapor permeable composite structures may be formed from vapor permeable outer layers and a PTFE-aerogel core material that is permeable to the diffusion of vapors. Examples of vapor or gas permeable membranes for use in outer layers of the composite include layers comprising ePTFE, silicone, polyurethane, polycarbonate, paper, and other porous and gas permeable membranes, and may be used in applications where moisture vapor permeability, or breathability is desired or required, such as 'breathable' clothing and footwear, 'breathable' blankets, and other types of 'breathable' insulation. In some applications such as outdoor clothing breathability and liquid water impermeability are required. This can be achieved by the use of either microporous membranes or continuous polymer films or coatings of water vapor permeable polymers such as hydrophilic polyurethanes, polyesters, and the like. A preferred embodiment of the present invention is a vapor permeable composite structure comprising a core of PTFE-aerogel material bonded between two outer layers comprising ePTFE membrane.

Further preferred are stretchable composites formed from elastic membrane layers and core material located there between. Preferred elastomeric layers are thermoplastic elastomers. Further preferred are layers comprising polyurethane, polyester, polyamide, and copolymers thereof. Preferred stretchable insulating tape is capable of recovering most or all of its original dimensions and may be releasably stretched without a substantial change or degradation of thermal properties. By "substantial" it is meant a change in thermal properties of about ±1 to 3 mW/m K. Elastic layers suitable for use in the present invention include polyurethanes, silicones, and the like and copolymers thereof. Applications for stretchable insulating composites include apparel, particularly gloves, socks, hats and stretchable clothing, insulative blankets, immersion suits, insulative gaskets, insulative bandages, and the like.

Composites having a core of material between outer film or membrane layers may be made by any method known in the art for forming multi-layer composites such as vacuum formation, continuous roll processing, extrusion, lamination, heat compression, adhesive or non-adhesive bonding and the like, to form an insulating structure. The outer layers provide strength, durability, elasticity and other properties to the tape, depending on the composition.

Figure 8A:
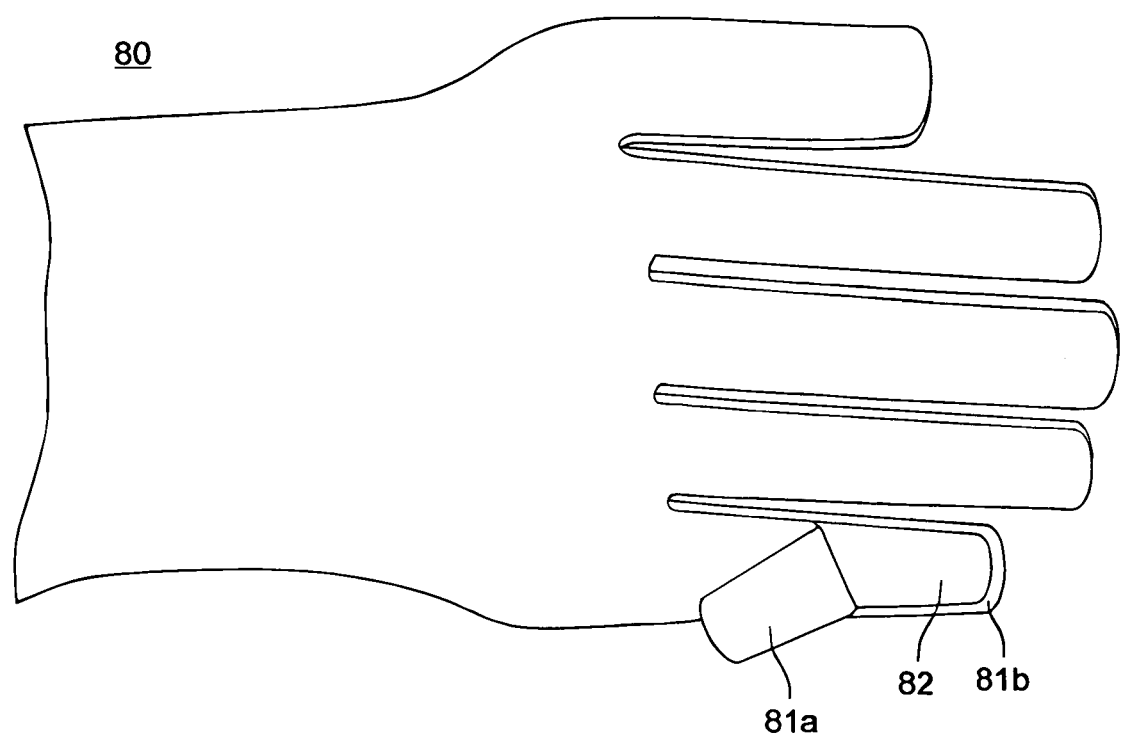
FIG. 8a is a diagrammatic representation of an insulating glove insert of the present invention.
Figure 8B:
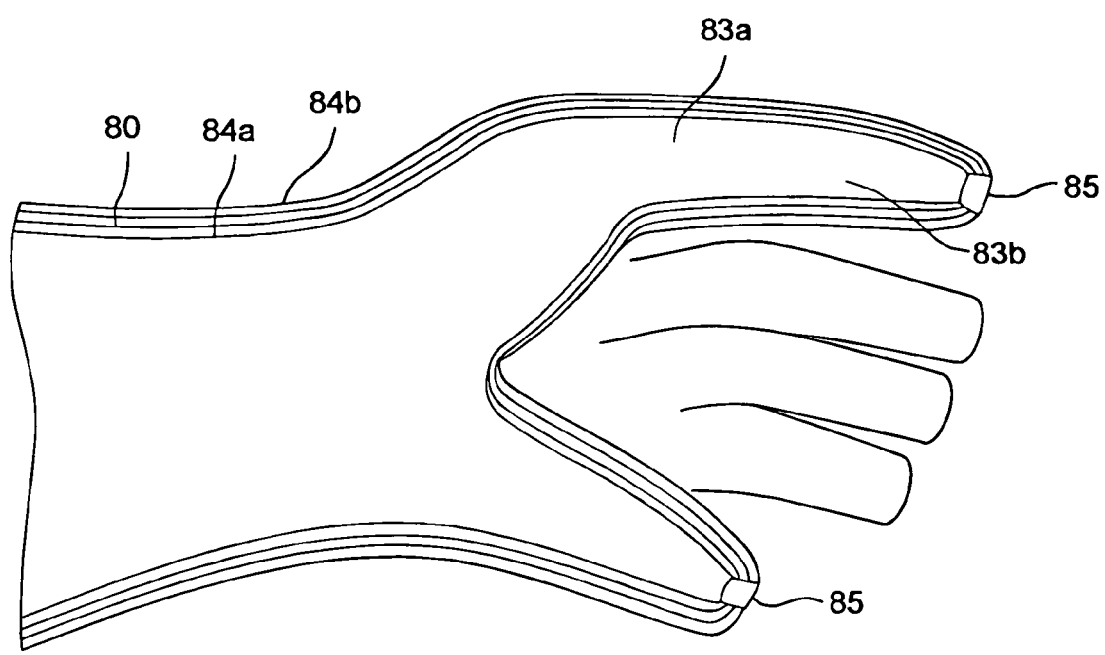
FIG. 8b is a diagrammatic representation of an insulated glove of the present invention.

Advantageously, structures and composite structures, such as sheets or tapes made from materials of the present invention, are suitable for cutting, and may be cut into shapes appropriate to insulate items such as coolers, canteens, dewars, hands, feet or other body areas, and electronic devices such as laptop computers, cellular phones and the like. Insulating structures may be cut to form insulative inserts which are incorporated into items, for example, by gluing, sewing, or by being contained between surfaces of double-walled containers, between multiple layers or sleeves of materials, such as textile, metal, cardboard, and the like. Composite tapes are preferred which are non-dusting upon the cut surface. Tape or sheets may be molded into three-dimensional shapes to insulate irregularly shaped objects. For example, insulating inserts or liners for boots or gloves may be constructed, as illustrated, for example, in FIG. 8a for gloves. FIG. 8a is diagrammatic representation of a insulating glove insert 80 of the present invention, which is illustrated as a composite comprising two outer composite layers 81a and 81b, and the insulating material of the present invention 82 between the layers 81a and 81b. Insulated articles of the present invention may have one or more than one insert. For example, the insulating insert may be placed on the palm side surface of a glove and may be affixed between outer and inner textile layers (FIG. 8b, 84a and 84b). Alternatively, insulative inserts 80 may be placed on both upper 83a and lower 83b hand surfaces as illustrated in FIG. 8b. Each insert is incorporated into an article and affixed 85 between inner 84a and outer 84b textile layers, by any manner known in the art for affixing textile layers or other insulation, such as by adhesives, sewing, and the like. Insulative inserts 80 may be structures comprising the insulating material of the present invention or may be composite insulating structures. Likewise, inserts for boots may be located on upper footwear surfaces such as an upper toe cap region, and lower sole surfaces. Inserts may be incorporated into footwear by any manner known in the art for incorporating footwear layers and insulation, and may be affixed between inner and outer shoe materials such as textile, leather, plastic and the like, by sewing, adhesives, and the like.

In another embodiment, insulating structures may be useful in portable electronic devices such as notebook computers, PDA's (personal digital assistants), cell phones and the like. As the size of the physical envelope or enclosure of the device decreases, and/or functionality of the device increases, thermal management becomes a challenge. Increased functionality often generates more heat in certain components of electronic devices. Reduced enclosure sizes position heat-generating components in closer proximity to outer enclosures, increasing the ease at which the components conduct heat to outer enclosure surfaces. In these cases, outer enclosure surfaces that are in direct contact with a user may become uncomfortably hot. Insulating materials may form useful barriers between heat generating components and device enclosures, thereby eliminating or delaying the transfer of heat from certain components to at least a portion of the device enclosure surface that is designed to be in direct contact with a user. The temperature of at least a portion of the device's enclosure surface that is in contact with a user can be reduced, and the physical comfort of a user can thus be increased while the device is being used. Alternately, insulating materials may form a barrier between the outer enclosure surface of a device and a user, thereby eliminating or delaying the transfer of heat between a heated device outer surface and a user.

Figure 9:
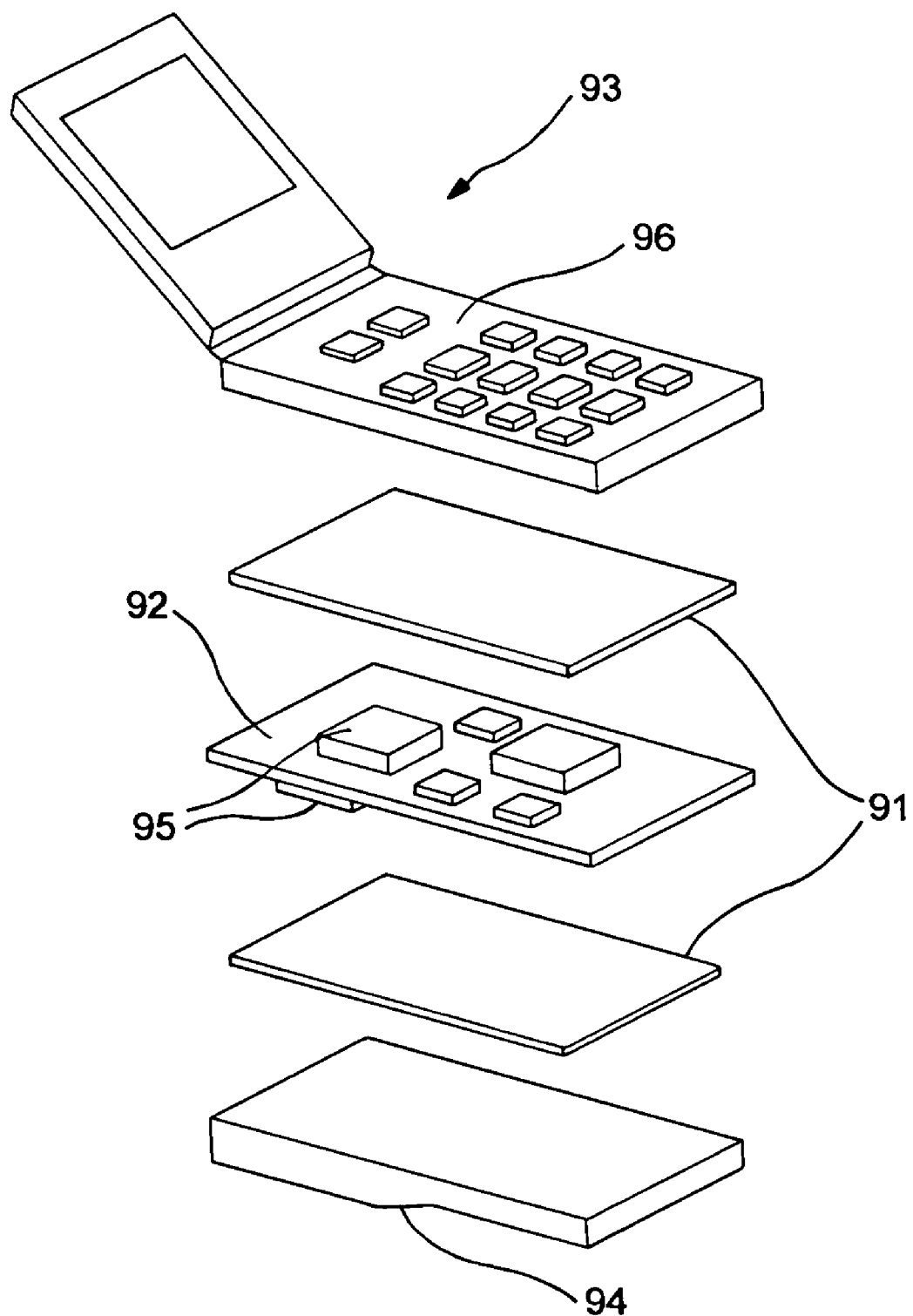
FIG. 9 is a perspective view of an insulated cell phone device of the present invention.
Figure 10:
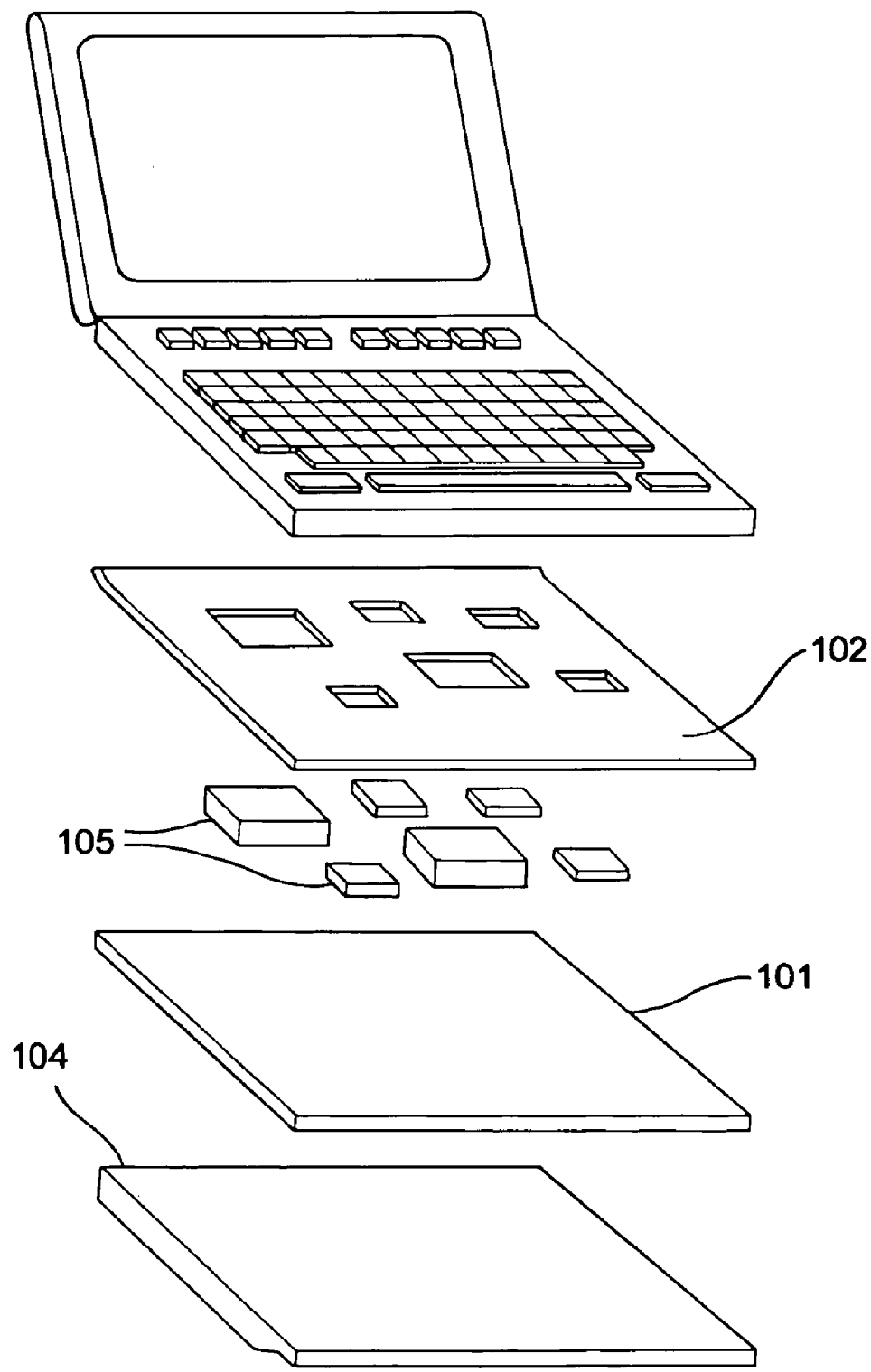
FIG. 10 is a perspective view of an insulated portable computer device of the present invention.

In one example, as illustrated in FIG. 9, a cellular phone is illustrated having at least one insulating structure 91, wherein the insulating structures 91 may be placed between a printed circuit board 92 with heat generating components 95 (such as a power amplifier, multimedia processor, and the like) and a keypad enclosure surface 96 of the cellular phone that is often in contact with a user's face (not shown). An insulating structure 91 may also be placed between a printed circuit board 92 with heat generating components 95 and a back enclosure surface 94 of the cellular phone that may contact a user's hand (not shown). In another embodiment (not shown), an insulating structure 91 may be located external to an enclosure surface 94 or 96, for example the insulating structure may be located on at least a portion of an enclosure outer surface that is designed to be in contact with a user's hand. In FIG. 10, a notebook computer is illustrated having an insulating structure 101, wherein the insulating structure 101 is placed between a printed circuit board 102 with heat generating components 105 such as a CPU (central processing unit) or a GPU (graphics processing unit) and a bottom enclosure surface 104 of the notebook computer that is often in contact with the user's lap (not shown). In another embodiment (not shown), an insulating structure 101 may be located external to at least a portion of the bottom enclosure surface 104. Preferably the insulating component is attached to a portion of an enclosure outer surface that is may be in contact with a user's lap.

In another embodiment, a portable electronic device comprises an electronic device, such as a cell phone or computer, and carrying case, wherein the carrying case comprising an insulating structure. Preferably, the insulating structure may be located between multiple layers of a carrying case.

Advantageously, insulating structures with low thermal conductivity may be formed that are sufficiently thin to be incorporated into such devices, or external to such devices, without any increase or without any significant increase in the overall dimensions of the physical enclosure. Preferred insulating structures for use in electronic devices comprise insulating materials of the present invention and are in the form of a tape or sheet, die-cut or otherwise formed to a dimensional size to fit readily into unused space in the device. Preferred are composites comprising insulating material of the present invention bonded between two outer layers, such as ePTFE, however insulating structures without outer layers may also be useful. Additional materials may be incorporated into the electronic device, which work in conjunction with an insulating material, such as highly thermally conductive materials. Highly thermally conductive materials may be positioned to intentionally conduct heat away from an enclosure surface, as opposed to blocking or delaying it.

One embodiment of the present invention is directed to a portable electronic device comprising at least one heat generating component, an enclosure, and at least one insulating structure located between the heat generating component and the enclosure. While the insulating structure may be directly adjacent to heat generating components and an enclosure, it is contemplated that additional components, unrelated to thermal insulation, may be positioned between the components of this arrangement. Further, a method is disclosed for increasing the comfort of a user of a portable electronic device comprising the steps of providing a portable electronic device having at least one heat generating component and an enclosure having a surface, placing an insulating structure between the heat generating component and the enclosure, and preventing or delaying the transfer of heat generated from the components to at least a portion of the enclosure surface. Alternatively, the method comprises the steps of placing an insulating structure between the enclosure outer surface and the user, and preventing or delaying the transfer of heat, generated from the at least one component, to a user.

In general, the properties of the final structures of the aerogel/PTFE materials of the present invention advantageously have greater formability, reduced dusting, increased mechanical strength and lower thermal conductivity than other insulating materials and these properties may depend in part on the proportions of PTFE and aerogel in the mixture. The thermal conductivity of the material may further depend on the pore size distribution within the material of the present invention, the particle size distribution of both aerogel and PTFE, as well as the compression during molding or tape formation, or the density of the resulting insulating structure. The presence of pores greater than about 100 nm within the insulating material or structures, that is pores that are greater than the mean free path of air molecules, may result in an increased thermal conductivity of the structure. The following examples are illustrative of the range of compositions and properties that may be attained by a few of the embodiments of the present invention, and are not intended to be limiting.

TESTS

Test 1: Particle Shedding from the Insulating Structure

The number of particles shed from an insulating structure was determined using a USP '788 method for particulate matter in injections. A small sample of insulating material (between about 0.64 cm×0.32 cm and 1.3 cm×1.3 cm) was placed in 150–200 cm$^3$ of 50% wt de-ionized water and 50% wt isopropyl alcohol mixture in a beaker immersed in a sonicated water bath. The particles were extracted by sonication for 2 minutes (Branson 2200 ultrasonic bath). The isopropyl alcohol/water mixture was filtered through a 0.22 μm Millipore methyl cellulose filter prior to the experiment. The number of shed particles per unit volume was then measured using a Laser Particle Counting (LPC) technique by HIAC Royco Liquid Syringe Sampler 3000A with an 8000A counter and an MC200 laser, in the range of 0.2–5 μm at 100 cm$^3$/min. The number of shed particles per unit volume was determined by subtracting the reading for the number of particles in a sample containing the insulating material and the number of particles in the blank sample (background count). The background count was at least 1000× lower than the sample count for all measurements. The number of shed particles per gram of insulating material was calculated using the formula (Sample Counts/cm$^3$−Blank counts/cm$^3$)×extraction volume in cm$^3$/area extracted in grams. The number of shed particles per area of the insulating material was calculated using the formula (Sample Counts/cm$^3$−Blank counts/cm$^3$)×extraction volume in cm$^3$/area extracted in cm$^2$. Values were calculated from the known geometry of the sample and its bulk density. The total number of shed particles per mass and unit area was calculated by summing the total number of particles shed over the range of 0.2–2.5 μm.

Test 2: Thermal Conductivity Measurement

Thermal conductivity of samples of the present invention was measured using a custom-made heat flow meter thermal conductivity tester at atmospheric conditions (about 298 K and 101.3 kPa). The tester consisted of a heated aluminum plate with a heat flow sensor (Model FR-025-TH44033, Concept Engineering, Old Saybrook, Conn.) and a temperature sensor (thermistor) imbedded in its surface, and a second aluminum plate maintained at room temperature, also with a temperature sensor imbedded in its surface.

The temperature of the heated plate was maintained at 309.15 K while the temperature of the "cold" plate was kept at 298.15 K. The heat flow measurement (in W/m$^2$ K) was taken between two layers of thin aluminum foil (approximately 0.02 mm thick), which covered the plates of the conductivity tester. The diameter of the plates was about 10 cm. The thickness of the samples was measured using a digital micrometer (model ID-F125E, Mitutoyo Corp., Japan) between two thin rigid surfaces. The heat flow measurement was normally obtained within about two to five minutes after the sample was placed in the tester upon reaching a steady state.

Thermal conductivity was calculated from the measured heat flow and the thickness of the sample according to the formula: $k=L/(1/Q-1/Q_0)$, where k is thermal conductivity in mW/m K, L is sample thickness in mm, Q is heat flow in W/m$^2$ K, and $Q_0$ is a heat flow with no sample in place ($Q_0$=100 W/m$^2$ K).

EXAMPLES

Example 1

A non-dusting material putty was made comprising about 80% wt aerogel particles and about 20% wt PTFE.

A 4.37% wt dispersion containing about 0.8 kg of hydrophobic, surface treated powder of silica aerogel (Nanogel aerogel, grade OJ0008, Cabot Corp., Billerica, Mass.), jet-milled to a particle size of about 7 μm, was made in a 25 liter container by adding about 8.75 kg of isopropyl alcohol (VWR International Inc., Bridgeport, N.J.) and 8.75 kg of de-ionized water while agitating at 750 rpm for about 5 minutes. The agitation speed was then increased to 1500 rpm. About 0.2 kg of PTFE particles in dispersion, as 0.875 kg of a 23% wt polytetrafluoroethylene aqueous dispersion (TEFRMS 153, DuPont, Wilmington, Del.), was rapidly poured into the mixing vessel. Immediately after, about 0.5 kg of 0.4% wt Sedipure surfactant solution (CF803, Tensid-Chemie Vertriebsgesellschaft mbH, BASF Group, Koeln, Germany) was poured into the mix. The total of the solids in the slurry was about 5.1% wt. The co-coagulation was completed within about 1.5 minutes.

The slurry containing the coagulum was poured onto a perforated tray over a filtering medium to drain the liquid phase over about one hour. The effluent contained about 0.1% wt solids and appeared clear. The coagulum was dried at 433.15 K in a convection oven for 48 hours. The material dried into a cake with a thickness of approximately 20 mm. The cake was chilled to less than about 263.15 K and hand ground using a tight circular motion and minimal downward force through a 3.175 mm mesh stainless steel screen while maintaining the material at a temperature below about 263.15 K. The insulating material was manually compressed to a putty in a circular mold (approximately 76.2 mm in diameter, 6.35 mm thick) to a bulk density of about 181 kg/m$^3$. The density of the putty was determined volumetrically by dividing the mass of the putty by the volume of the circular mold.

The thermal conductivity of the molded cake was measured according to the test for Thermal Conductivity Measurements (Test 2), described above. The thermal conductivity of the molded cake was about 13.52 mW/m K.

Example 2

An insulating composite was prepared having a core material comprising 80% wt aerogel and 20% wt PTFE within an envelope of ePTFE membrane.

The material of Example 1, was poured into a rectangular mold having dimensions of 12 cm×13.3 cm×0.8 cm and slightly compressed into a putty. The mold containing the putty was placed between the two layers of aluminized plastic foil. The mold was removed leaving the molded putty between the two layers of the foil. Three sides of the foil around the molded putty were sealed using a hot iron to form an envelope. The envelope containing the putty was transferred into a vacuum packing machine, and the fourth edge of the envelope was sealed under vacuum of 1.5 kPa.

The final vacuum packed form was very flexible, did not form any cracks or edges upon flexing, and had an overall thickness of 7.12 mm and thermal conductivity of 9.55 mW/m K when measured substantially according to the test for Thermal Conductivity Measurements (Test 2) described above.

Example 3

An insulating structure was made from a material comprising about 80% wt aerogel and about 20% wt PTFE.

In a 75.7 liter open mixing vessel, about 29.2 kg of de-ionized water was added to about 29.2 kg. of isopropyl alcohol (VWR International, Inc., Bridgeport, N.J.). To this, about 2.68 kg of hydrophobic, surface treated silica aerogel (Nanogel aerogel, grade OJ0008 from Cabot Corp., Billerica, Mass.; jet-milled to a particle size of about 7 μm) was added. Using a standard propeller type impeller, the whole mix was agitated at 1500 rpm for four (4) minutes and then at 1000 rpm for another four (4) minutes to obtain a uniform slurry. To this slurry, about 0.68 kg of PTFE solids was added in the form of dispersion (TEFRMS 153, DuPont, Wilmington, Del.) containing about 26.3% by weight solids. The mix was agitated at 1000 rpm for one (1) minute to coagulate the PTFE in presence of silica aerogel. The coagulum was filtered, dried, chilled and screened into a granular powder as in Example 1.

About 0.82 kg of the above powder was blended with 2.1 kg of Isopar K™ liquid (Exxon Corporation, Houston, Tex.). The blended material was ram extruded at a rate of 0.33 m/minute through a die maintained at about 322.15 K, after subjecting it to a vacuum of at least 3.3 kPa. The die had a rectangular opening that measured 178 mm wide and 2 mm high. The extruded sheet was dried in a convection oven at about 473.15 K to remove the Isopar K hydrocarbon liquid.

The insulating structure was handleable, and non-dusting, and was about 2.4 mm thick. Thermal conductivity was measured substantially according to the test for Thermal Conductivity Measurements (Test 2) described above, and was about 15.1 mW/m K.

The method described in Test 1, Particle Shedding from the Insulating Structure, was used to determine the number of particles shed from the insulating structure. The samples used for the experiment had rectangular shape and dimensions of 1.3 cm×1.3 cm×0.245 cm, and the density of 261 kg/m$^3$. The shedding of the sample was compared to two different Aspen aerogel blankets (Aspen Aerogels, Inc., Marlborough, Mass.), Aspen AR3100 (without carbon black) and Aspen AR5200 (containing carbon black). Aspen AR3100 sample had dimensions of 1.3 cm×1.3 cm×0.64 cm and the density of 100 kg/m$^3$. Aspen AR5200 sample had dimensions of 0.64 cm×0.32 cm×0.32 cm and the density of 100 kg/m$^3$. The results presented in Table 1 are the average of the measurements for the three samples of insulation, and are reported in total particles per cm$^2$ and total particles per gram of sample. The results demonstrate lower shedding of particles from the insulating structures of the present invention compared with Aspen AR3100 and AR5200. Table 2 provides a comparison based on the ratio of total particles shed by Aspen aerogel blankets to the insulating structure of Example 3.

TABLE 1

Comparison between total number of particles shed from the insulating structure of Example 3 and Aspen aerogel blankets (Aspen AR3100 and Aspen AR5200)

| | total particles/cm$^2$ | total particles/g |
| --- | --- | --- |
| Insulating structure of Example 3 | 1.21E+06 | 1.90E+07 |
| Aspen AR3100 | 2.33E+06 | 3.64E+07 |
| Aspen AR5200 | 8.88E+08 | 2.78E+10 |

TABLE 2

Ratio of total particles shed of Aspen aerogel blankets to the insulating structure of Example 3.

| | total particles/cm$^2$ | total particles/g |
| --- | --- | --- |
| Aspen AR3100/structure of Example 3 | 1.93 | 1.92 |
| Aspen AR5200/structure of Example 3 | 7.34E+02 | 1.46E+03 |

Example 4

An insulating material was prepared comprising about 55% wt aerogel and 45% wt PTFE.

A mix of about 65.3 kg of de-ionized water with about 2.22 kg of isopropyl alcohol (VWR International, Inc., Bridgeport, N.J.) and about 0.44 kg of Zonyl FSO™ fluorosurfactant (Dupont Fluoropolymers, Wilmington, Del.) was prepared by agitating the mix in an 75.7 liter open vessel at about 600 rpm for about 30 seconds using a standard propeller type impeller. About 1.54 kg of silica aerogel (Nanogel aerogel, grade OJ0008, Cabot Corp., Billerica, Mass.), jet-milled to a particle size of about 7 μm, was gradually added while stirring at about 2300 to 2600 rpm. Agitation was continued for about six (6) minutes until a uniform slurry of the silica aerogel was obtained. The slurry was transferred to a 190 liter enclosed vessel and after stirring it at about 600 rpm for three (3) minutes with a propeller type impeller, about 4.92 kg of PTFE dispersion with a solids content of about 25.8 wt % was added. Agitation was continued at 600 rpm and the PTFE co-coagulated with the silica aerogel. After about three (3) minutes of agitation, the mix was poured onto perforated trays over a filtering medium to drain the liquid. The filtered coagulum was dried at about 438.15 K for about 24 hours. The dry coagulum was in the form of loosely bound powder, and was stored in a freezer at about 253 K.

Example 5

An insulating tape structure was made from a material comprising about 55% wt aerogel and about 45% wt PTFE.

The material of Example 4 was blended with Isopar K™ (Exxon Corporation, Houston, Tex.) in a ratio of about 2.5 kg of Isopar K™ liquid to 1 kg of the solid material. The blended material was held at about 322.15 K for at least 24 hours. The blended material was ram extruded at 0.25 m/min through a 25 mm diameter barrel after subjecting it to a vacuum of at least about 3.3 kPa. The die used had a rectangular opening that was 25 mm wide×0.8 mm high. Both the die and the barrel were maintained at about 322.15 K.

The extruded insulating tape was 25 mm wide and was dried in a convection oven at 473 K for 60 minutes. The resulting tape was strong, handleable, bendable, foldable and non-dusting. The insulating tape had a thickness of 1.08 mm. The thermal conductivity of 25 mm wide tapes was measured substantially according to the test for Thermal Conductivity Measurements (Test 2) described above, except that a first layer of four (4) strips of tape were laid side by side over the test plate followed by another similar layer of four (4) of tapes that were oriented in a direction perpendicular to the first layer. Thermal conductivity was measured to be about 17.9 mW/m K.

Example 6

An insulating structure was made from material comprising about 55% wt aerogel and about 45% wt PTFE.

The material of Example 4 was blended with Isopar K (Exxon Corporation, Houston, Tex.) in a ratio of about 2.5 kg of Isopar K liquid to 1 kg of the solid material. The blended material was ram extruded substantially as described in Example 3. The blended material was ram extruded at about 0.25 m/min through a 25 mm diameter barrel after subjecting it to a vacuum of at least about 3.3 kPa. The die used had a rectangular opening that was about 178 mm wide×0.8 mm high. Both the die and the barrel were maintained at about 322.15 K.

The extruded insulating tape was dried in a convection oven at 473 K for 60 minutes. The insulating tape structure had a thickness of about 2.5 mm, a density of about 250 kg/m$^3$, and a width of about 148 mm. Thermal conductivity of the tape was about 18.9 mW/m K when measured substantially according to the test for Thermal Conductivity Measurements (Test 2) described above.

Example 7

An insulating composite tape was made comprising a core material comprising about 55% wt aerogel and about 45% wt PTFE, and two outer layers of ePTFE membrane.

The insulating tape of Example 6 was laminated to two layers of expanded ePTFE membranes to create a composite structure using heat and pressure. A layered structure was prepared having a first layer of an ePTFE membrane (W.L. Gore & Associates, Inc., Elkton, Md.), having thickness of about 28 μm, mean flow pore size of about 0.21 μm, and mass per unit area of about 16.9 g/m$^2$, upon which a light sprinkling of fluorothermoplastic powder (Dyneon™ THV™ 220A, Dyneon LLC, Oakdale, Minn.) was deposited. The insulating tape of Example 6 was placed upon the first layer, followed by another sprinkling of THV 220A on top of the tape, and a second layer of ePTFE membrane. The entire layered structure was pressed at about 473.15 K and approximately 300 kPa using a Carver Press for about three minutes.

The resulting insulating composite structure was about 2.6 mm thick, had density of about 250 kg/m$^3$, and had a thermal conductivity of about 18.4 mW/m K when measured substantially according to the test for Thermal Conductivity Measurements (Test 2) described above.

Example 8

An insulating composite tape was made comprising a core material comprising about 55% wt aerogel and about 45% wt PTFE, and two outer layers of polyurethane membrane.

The insulating tape of Example 6 was laminated to two layers of thermoplastic polyurethane film to create a composite structure using heat and pressure. A layered structure was prepared having first and second layers of polyurethane (Dureflex® PT1710S, Deerfield Urethanes, Inc., South Deerfield, Mass.) film having a thickness of about 25.4 μm on both sides of the insulating tape. The layered structure was heat laminated at about 423.15 K and approximately 340 kPa pressure using a Carver press for about 2 minutes to create an insulating composite structure. The resulting composite structure was about 2.56 mm thick, had density of about 250 kg/m$^3$, and a thermal conductivity of about 17.2 mW/m K when measured substantially according to the test for Thermal Conductivity Measurements (Test 2) described above.

Example 9

A material was prepared comprising about 75% wt of aerogel and about 25% wt PTFE.

In a 3.6 liter container, about 2.1 kg of de-ionized water and 0.07 kg of isopropyl alcohol (VWR International Inc., Bridgeport, N.J.) were mixed with about 0.021 kg of Zonyl FSO™ fluorosurfactant (DuPont Fluoropolymers, Wilmington, Del.). About 0.07 kg of silica aerogel (Nanogel aerogel, grade OJ0008, Cabot Corp., Billerica, Mass.), jet-milled to a particle size of about 7 μm, was gradually added to the mix while agitating at 2000 rpm to form a dispersion. Agitation was continued for six (6) minutes until a uniform slurry was obtained. To this slurry, about 0.0877 kg of PTFE dispersion with solids content of about 26.6 wt % was added while agitating at 1500 rpm. Agitation was continued at 1500 rpm for about two (2) minutes and the PTFE co-coagulated with the silica aerogel.

The liquid containing the coagulum was poured over porous trays and filtered. The filtered coagulum was dried at 438.15 K for about 24 hours. The dry coagulum was in form of a loosely bound powder.

Example 10

An insulating tape structure was made from a material comprising about 75% wt aerogel and about 25% wt PTFE.

The material of Example 9 was blended with Isopar K (Exxon Corporation, Houston, Tex.) in a ratio of about 3.0 kg. Isopar K to 1 kg of insulating material. The blended material was held at about 322.15 K for at least 24 hours. The blended material was ram extruded at 0.25 m/min through a 25 mm diameter barrel and a die having an opening of about 25 mm wide×8 mm high. Both the die and the barrel were maintained at about 322.15 K.

The extruded insulating tape structure was about 25 mm wide, and was dried in an oven at 473 K for about 60 minutes. The resulting tape was strong, handleable and non-dusting, and was 1.07 mm thick. The thermal conductivity of the tape was measured substantially according to Example 5 and was about 15.2 mW/m K.

Example 11

A material was formed comprising about 55% wt aerogel, 40% wt PTFE, and about 5% wt carbon black.

In a 3.6 liter container, 2 kg of de-ionized water was mixed with about 0.0142 kg of a hydrocarbon surfactant (Tomadol 1-5™, Tomah Products Inc., Milton, Wis.). About 0.0641 kg of silica aerogel (Nanogel aerogel, grade OJ0008, Cabot Corp., Billerica, Mass.), jet-milled to a particle size of about 7 μm, was added to form a dispersion. The dispersion was agitated at 2000 rpm for about three (3) minutes to obtain a uniform slurry. In a separate container, 0.006 kg carbon black (Ketjenblack™ EC300J, Akzo Nobel Polymer Chemicals, Chicago, Ill.) was dispersed in 0.5 kg de-ionized water by agitating the mix at 1500 rpm for about two (2) minutes. The carbon black slurry was then added to the silica aerogel slurry and mixed at 1500 rpm for about two (2) minutes. To this slurry mixture, about 0.1754 kg of PTFE dispersion with solids content of about 26.6 wt % was added while agitating at 1500 rpm.

After about two (2) minutes of agitation, the liquid containing the coagulum was filtered, and the coagulum was dried at about 438.15 K for about 24 hours. The dry coagulum was in form of a free flowing fine powder.

Example 12

An insulating tape structure was made from a material comprising about 55% wt aerogel, about 40% wt PTFE, and about 5% wt carbon black.

The material of Example 11 was blended with Isopar K (Exxon Corporation, Houston, Tex.) at a ratio of about 2.79 kg of Isopar K liquid to about 1 kg of the insulating material. The blended material was held at about 322.15 K for at least 24 hours. The blended material was ram extruded at about 0.25 m/min through a barrel having a diameter of 25 mm after subjecting it to a vacuum of at least about 3.3 kPa. The die used had a rectangular opening of 25 mm wide×0.8 mm high. Both the die and the barrel were maintained at about 322.15 K. The extruded tape was dried in a convection oven at 473 K for about 60 minutes.

The extruded insulating tape was strong, handleable and non-dusting. The tape was 1.02 mm thick and its density was 210 kg/m$^3$. Thermal conductivity was measured substantially according to Example 5 and was about 16.5 mW/m K.

We claim:

1. A materiel comprising
   greater than or equal to about 40% wt aerogel particles and
   less than or equal to about 60% wt polytetrafluoroethylene (PTFE) particle having a particle size of from about 50 nm to about 600 μm as a binder,
   wherein the material is a powder or a putty, and the material has a thermal conductivity of less than or equal to 25 milliwatts per meter Kelvin (mW/m K) at atmospheric conditions (298.15 K and 101.3 kPa).

2. The material of claim 1 wherein the material has a thermal conductivity of less than or equal to about 20 mW/m K at atmospheric conditions (298.15 K and 101.3 kPa).

3. The material of claim 1 wherein the material has a thermal conductivity of less than or equal to about 17 mW/m K at atmospheric conditions (298.15 K and 101.3 kPa).

4. The material of claim 1 wherein the aerogel has an average pore size less than or equal to about 100 nm.

5. The material of claim 1 wherein the aerogel is present in an amount of greater than or equal to about 60% wt.

6. The material of claim 1 wherein the aerogel is present in an amount of greater than or equal to about 80% wt.

7. The material of claim 1 wherein the aerogel is formed from an inorganic oxide.

8. The material of claim 1 where the aerogel is silica aerogel.

9. The material of claim 1 further comprising at least one additional component selected from opacifiers, dies, fibers and polymers.

10. The material of claim 9 wherein the opacifier is carbon black, titanium dioxide, iron oxides, silicon carbide, molybdenum silicide, manganese oxide or polydialkylsiloxanes, wherein the alkyl groups contain 1 to 4 carbon atoms.

11. The material of claim 1 wherein the material is formable or moldable.

12. The material of claim 1 wherein the material is between two walls of a double walled container.

13. The material of claim 1 wherein the material is formed as a tape.

* * * * *

UNITED STATES PATENT AND TRADEMARK OFFICE
CERTIFICATE OF CORRECTION

PATENT NO. : 7,118,801 B2
APPLICATION NO. : 10/706777
DATED : October 10, 2006
INVENTOR(S) : Ristic-Lehmann et al.

It is certified that error appears in the above-identified patent and that said Letters Patent is hereby corrected as shown below:

Column 20, line 11: change "materiel" to --material--

Column 20, line 15: change " particle" to --particles--

Signed and Sealed this

Thirteenth Day of March, 2007

JON W. DUDAS
*Director of the United States Patent and Trademark Office*